United States Patent [19]

Roessler

[11] 4,150,389

[45] Apr. 17, 1979

[54] N-CHANNEL MEMORY FIELD EFFECT TRANSISTOR

[75] Inventor: Bernward Roessler, Munich, Fed. Rep. of Germany

[73] Assignee: Siemens Aktiengesellschaft, Berlin & Munich, Fed. Rep. of Germany

[21] Appl. No.: 834,428

[22] Filed: Sep. 19, 1977

[30] Foreign Application Priority Data

Sep. 29, 1976 [DE] Fed. Rep. of Germany ....... 2643932

[51] Int. Cl.$^2$ ............................................. H01L 29/78
[52] U.S. Cl. ....................................... 357/23; 357/13; 357/41; 357/45; 357/59
[58] Field of Search ........................ 357/13, 23, 59, 41, 357/45

[56] References Cited

U.S. PATENT DOCUMENTS

| | | | |
|---|---|---|---|
| 3,919,711 | 11/1975 | Chou | 357/23 |
| 3,996,657 | 12/1976 | Simko et al. | 357/59 |
| 4,004,159 | 1/1977 | Rai et al. | 357/41 |
| 4,016,588 | 4/1977 | Ohya et al. | 357/13 |

Primary Examiner—Edward J. Wojciechowicz
Attorney, Agent, or Firm—Hill, Gross, Simpson, Van Santen, Steadman, Chiara & Simpson

[57] ABSTRACT

An erasable programmable read-only memory employing an n-chanel memory FET. A MOSFET is used having a floating memory gate which includes erasing projections ("tongues") on the floating memory gate. One tongue covers the drain and the other tongue covers the source. Erasing occurs bit-wise via the drain-side tongue; erasing word-wise or matrix-wise via the source-side tongue. Bit-wise, word-wise and matrix-wise erasing is obtained as desired. It is applicable for REPROM chips, and in particular, for programmable memories of miniature calculators.

13 Claims, 7 Drawing Figures

N-CHANNEL MEMORY FIELD EFFECT TRANSISTOR

CROSS REFERENCE TO RELATED APPLICATIONS

Cross reference is hereby made to applicant's copending related application, Ser. No. 750,860, filed Dec. 15, 1976, assigned to the same assignee as the present invention. Application Ser. No. 750,860 is a continuation of Ser. No. 674,682. The disclosure of said application Ser. No. 750,860 is incorporated herein by reference.

INTRODUCTION

This invention relates to an n-channel memory FET, and particularly to ones that are suitable for use in programmable memories of miniature calculators.

It is known that an IGFET with a floating gate may be used as a memory device. When the gate electrode of a conventional IGFET is modified to incorporate a control gate separated from the floating gate by an insulator, the device may be made to function as a memory device. The new structure can be made to serve as a memory device in which semipermanent charge storage is possible. A high positive bias on the control gate electrode and on the drain with respect to the source would cause electron accumulation in the floating gate due to the acceleration of electrons in the conducting channel, especially if the channel is short, for instance 1 to 6μ.

The present invention relates to an improvement in the structure described in German Application No. P 24 45 137.4-33, assigned to the same assignee as the present invention.

THE PRIOR ART

The present invention is also a further improvement over the structure described in Luxemburg Patent No. 72 605, issued Aug. 21, 1975, and in German published patent application No. 25 13 207.

In the above referred to earlier filed application P 24 45 137.4-33, and in the above referred to Luxemburg Patent, a tongue serves for combatting the contamination of the insulating material during the erasing, i.e., during discharge of the electrically floating memory gate. By applying an erase voltage to the control gate, and particularly by simultaneous application of an avalanche breakdown voltage to the blocking pn-junction between the substrate and the respective connection region (source or drain) covered by the tongue, electrons stored in the memory gate can be withdrawn by Fowler-Nordheim tunneling and can be compensated by hot holes produced by the loading of the pn-junction to avalanche breakdown which thus results in a discharge of the memory gate. During the erasing of charges from the memory gate, the discharge currents flow through other regions of the insulator than do the charging currents during programming. This application of different insulator regions for discharge currents on the one hand, and for charging currents on the other hand, effectuated the relatively good constancy of the minimum erasing voltages and the minimum programming voltages.

The definition of source and drain corresponds here to the source-drain current direction during the programming. A "cover" between the tongue, on the one hand, and the connecting region, i.e., source or drain, on the other hand, is present if the spacing between the tongue and the respective connecting region is so small that the tongue potential capacitively, i.e., by electrostatic induction, influences the near-to-tongue surface of this connecting region. In particular, the charge density there, or the avalanche breakdown voltage of a substrate connecting region pn-junction attached in the tongue vicinity.

In the aforesaid application, FIG. 4, a memory matrix is shown which contains a single n-channel memory FET as a memory cell. The control gates of the individual n-channel memory FETs are connected line-wise to one another via horizontal-line lines. The drains of the n-channel memory FETs are connected together column-wise via column lines. All sources of the matrix are connected with one another, and, in addition, are connected to the common switching point.

The individual n-channel memory-FET can be triggered in various ways, particularly when used within such a memory matrix, which in each case contains only a single n-channel memory FET per memory cell. The drains and the sources can namely be triggered differently among one another, for example, column-wise, compare the drains in the named matrix example, or matrix-wise, compare the sources in the named matrix example. Thus, by application of a drain potential, another group of n-channel memory FETs of this matrix can be triggered by application of the source potential, since, by application of the source potential in this matrix example, all n-channel memory FETs of the matrix are simultaneously triggered.

For erasing an n-channel memory FET attached in a matrix, at least two triggerings are simultaneously necessary, namely a first triggering column-wise and a second triggering line-wise. At the intersection points, the n-channel memory FET attached there is erased or, respectively, at the various simultaneously triggered intersection points, the various n-channel memory FETs respectively attached there are simultaneously erased. On the other hand, none of the n-channel memory FETs triggered only by one of the two triggerings is erased, because the potentials at the remaining terminals of these n-channel memory FETs prevent the erasing.

In the cited application and in Luxemburg Patent, it is already indicated that, in particular in the case of n-channel memory FETs with an enhancement type channel region, instead of or besides the utilization of the avalanche breakdown voltage, i.e., of the avalanche effect, additional effects, in particular the Fowler-Nordheim tunnel effect and the gate surface effect, can also be utilized for erasing the charged memory gate. For this purpose, a voltage of corresponding polarity and amplitude is to be applied between the control gate and that main-section region, namely the source and/or the channel region corresponding to the substrate and/or the drain, towards the discharge of the memory gate is to occur, compare, in particular, Luxemburg Patents No. 72 683 and 72 684, issued on Sept. 29, 1975.

From U.S. Pat. No. 3,919,711, FIGS. 2 to 4, a memory FET of the enhancement type (preferably having a p-channel) is known which has a floating memory gate 20, surrounded on all sides by an insulator, but no control gate, compare column 2, lines 44 to 49. The channel region is non-conductive with a discharged memory gate, but conductive with a charged memory gate 20, compare column 6, lines 2 to 20 (the charging occurs, by the way, by means of the avalanche effect, compare column 3, lines 27 to 44).

SUMMARY OF THE INVENTION

It is an object of the present invention to provide a novel n-channel memory FET which requires particularly low operating voltages which is constructed in such a manner and without the necessity of having to mount extremely low ohmic column switches not only for the sources but also for the drains, which can be used to erase the memories bit-wise, word-wise or also matrix-wise with little contamination if it is utilized in the memory matrix.

The n-channel memory FET of the present invention has the additional ability that it can also be selectively erased towards the source or towards the drain with little contamination if it is not utilized in a matrix but rather as individual n-channel memory FET. This enables the n-channel memory FET to be dimensioned and operated in a way such that the avalanche effect and/or the Fowler-Nordheim tunnel effect and/or the gate surface effect can be utilized for the erasing.

The inventive objective is resolved in that two such conductive tongues are conductively connected to the memory gate from which the first tongue covers a portion of the drain, and from which the second tongue covers a portion of the source.

For the one skilled in the art who is not informed about the invention, at first no particular purpose would be seen in the fact that to be able to erase the same n-channel FET without contamination not only on the source side but also, perhaps simultaneously, at the drain side, particularly because this presupposes a complication of the mode of operation which seems unnecessary, and primarily because this also is a complication of the structure of this n-channel memory FET.

However, a benefit is already provided in the special case—if only one single n-channel memory FET is mounted in a circuit—namely the advantage that with the aid of the simultaneous discharge via the source-sided tongue and via the drain-sided tongue, an approximate doubling of the discharge velocity, ergo a halfing of the discharge time is obtained. The invention permits additionally that the n-channel memory FET is erased only at the source side or only at the drain side if the demand requests it.

Even in the case where several inventive n-channel memory FETs are arranged in a matrix, particular advantages are present which are now to be described: In the following that respective chronologically constant or altered potential to be applied there is respectively referenced "source potential", "drain potential" and "control gate potential", in short. Thereby the simultaneous application of at least two such potentials is required for the erasing, namely the "drain potential" and/or "source potential", on one hand, and the "control gate potential", on the other hand. Potentials of such magnitude which could not trigger an erasing effect in the corresponding n-channel memory FET or which perhaps even prevent the erasing, are not mentioned in the following due to the ease of inspection, or are clearly referenced as such.

Thus, the inventive n-channel memory FET can be erased with little contamination via the first tongue on the drain side, and can be erased with little contamination via the second tongue on the source side. Depending, whether, for example, a source potential or a drain potential is applied to the inventive n-channel memory FET, the erasing proceeds on the source side or on the drain side. As the inventive n-channel memory FET, as well as the n-channel memory FET disclosed in the main application, can respectively be contained in one cell, for example, in a memory cell of a memory matrix, and as the connections of the control gates, drains and sources of said n-channel memory FETs, mounted in the matrix, can, to a large extent, be produced independently from one another and arbitrarily, to a large extent. If the matrix is wired two-dimensionally, these conditions, for example, can correspond with a horizontal line and a column line. Compare, for example, FIG. 4 of the application. The inventive measure permits for the purpose of erasing, and thus for the discharge of the previously negatively charged memory gate, the triggering of a different group of n-channel memory FETs and/or a different number of n-channel memory FETs with the corresponding potential, and particularly by the selection whether source potential or drain potential is conveyed, ergo whether the erasing is done via the first tongue or via the second tongue. Due to the possibility of respectively triggering a different group and/or a different number of n-channel memory FETs with potentials in a matrix, particularly with drain potentials or source potentials, or similarly even with control gate potentials, one can respectively select others of the n-channel memory FETs from the sum of all n-channel memory FETs for the erasing, depending on the free choice whether one conveys source potential or drain potential.

In the utilization of the inventive n-channel memory FETs, particularly in a memory matrix, one is not forced to simultaneously apply source potential and drain potential to the selected n-channel memory FET, triggered for the erasing along with the control gate potential. Instead, the possibility exists to apply only the drain potential in addition to the control gate potential, or only additionally the source potential.

Thus, one can simultaneously, alone already by the choice whether drain or source potential is conveyed, and how the control gate potential is conveyed, erase a single, or a specific group of, or all n-channel memory FETs of the matrix. In that, for example, one additionally simultaneously applies the control gate potential only to one single line of the matrix sample, thus, the erasing of only one single bit (in the matrix sample selected, with purely drain-sided erasing) or of a word (with source-sided erasing) is obtained. Due to the fact that one applies the control gate potential to several lines, in each of these lines one respective single bit is erased (with drain-side erasing), or all words stored in these lines (with source-side erasing) are simultaneously erased.

However, in n-channel memory FETs, arranged in relation to a matrix, it is additionally possible to simultaneously erase on the drain side as well as on the source side in that, simultaneously, not only drain potential and source potential, on one hand, is applied, but also control gate potential, on the other side. Thereby in inventive n-channel memory FETs, arranged in relation to a matrix, a halfing of the erase-time can also be obtained, and indeed in bit-wise, and in word-wise, and also in matrix-wise erasing. One only has to select the connections of the memory gates, the drains and sources among one another and also the applying of the memory gate, source and drain potentials, such that, as intended, only a single n-channel memory FET or, when needed, only the n-channel memory FETs storing a word, or even all n-channel memory FETs are simultaneously triggered via the control gate, on one hand, and not only via the source but also the drain, on the other hand that; however, the remaining n-channel memory FETs are neither triggered with the control gate potential nor with the source potential, and also not with the drain potential.

BRIEF DESCRIPTION OF THE DRAWINGS

The invention is further exemplified in the drawings, which illustrate a preferred embodiment.

Figure 1:
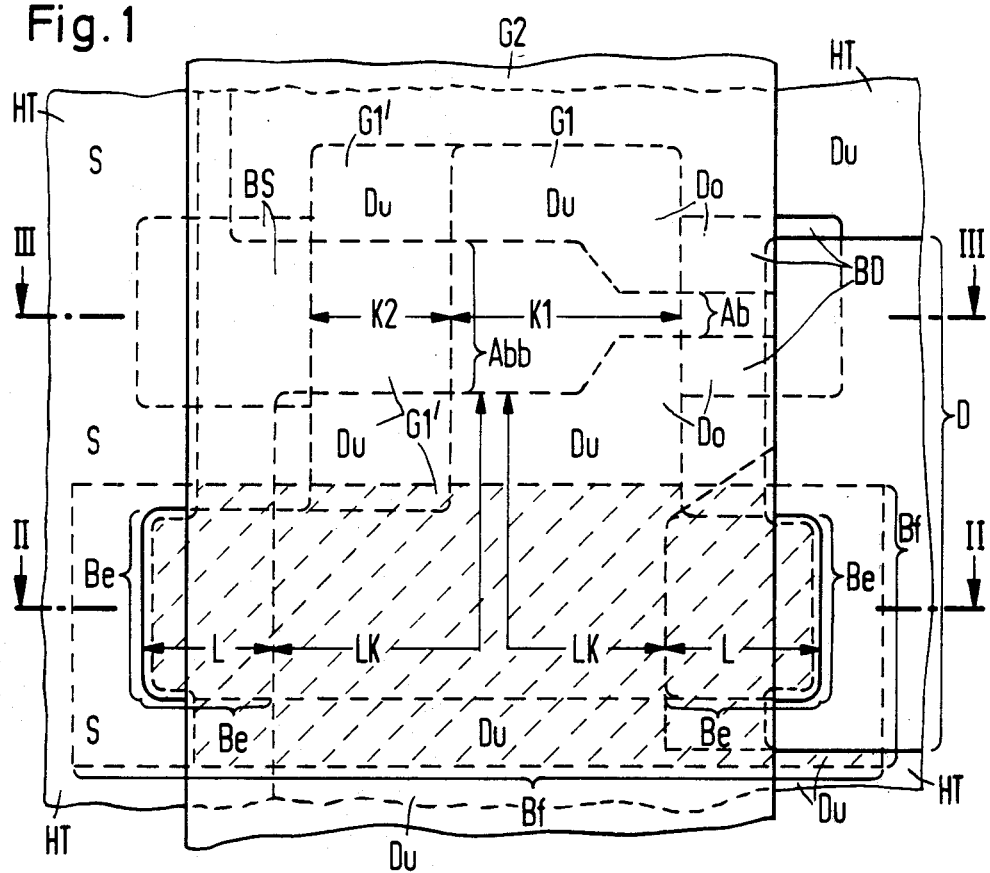
FIG. 1 illustrates diagrammatically the top view of a preferred embodiment.

Thus, FIGS. 2 through 7 primarily function to better explain the preferred embodiment illustrated in FIG. 1.

DESCRIPTION OF THE PREFERRED EMBODIMENT

FIG. 1 illustrates a top view of an n-channel memory FET produced by integrated technique, said FET which exhibits additional characteristics of further developments which per se provide additional advantages along with the inventive characteristics.

Figure 5:
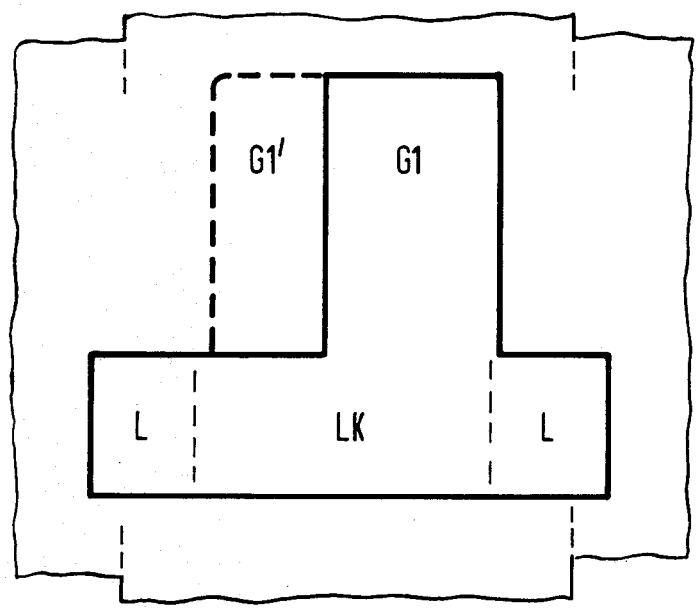
FIG. 5 shows the memory gate illustrated in FIG. 1, the two tongues and the conductive connection lying between the memory gate and the two tongues.

The n-channel memory FET, illustrated in FIG. 1, exhibits two different gates, namely the memory gate G1 and the control G2. The memory gate G1, which is also shown in FIG. 5, is electrically conductively connected via, for example, conductive tongues L consisting of doped polysilicon. The memory gate G1, together with the connection LK and the two tongues L can totally be produced, for example, of polycrystalline silicon, which, for its part, can additionally be doped such, for example, n-doped, particularly in order to render its eternal resistance small.

Figure 2:
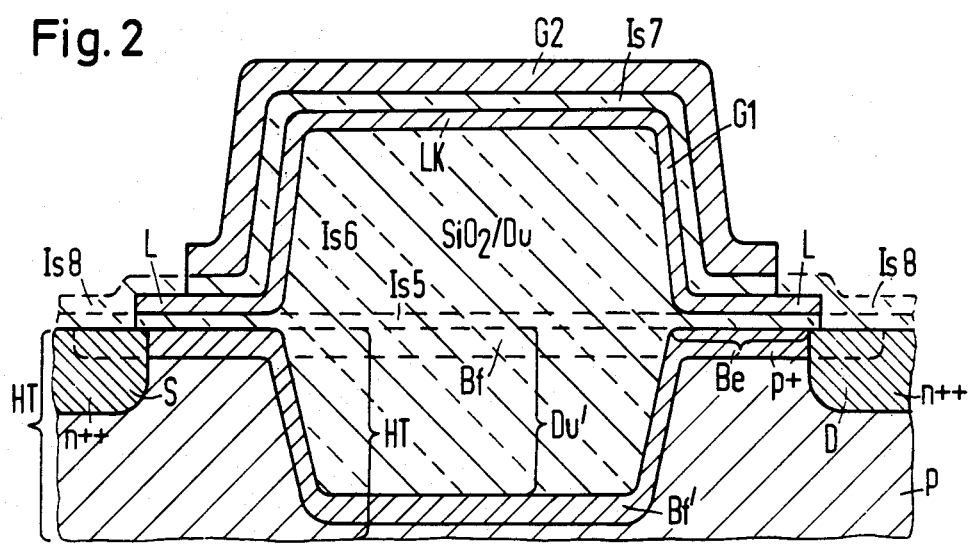
FIG. 2 is a fragmentary view taken along the line II—II of FIG. 1.
Figure 3:
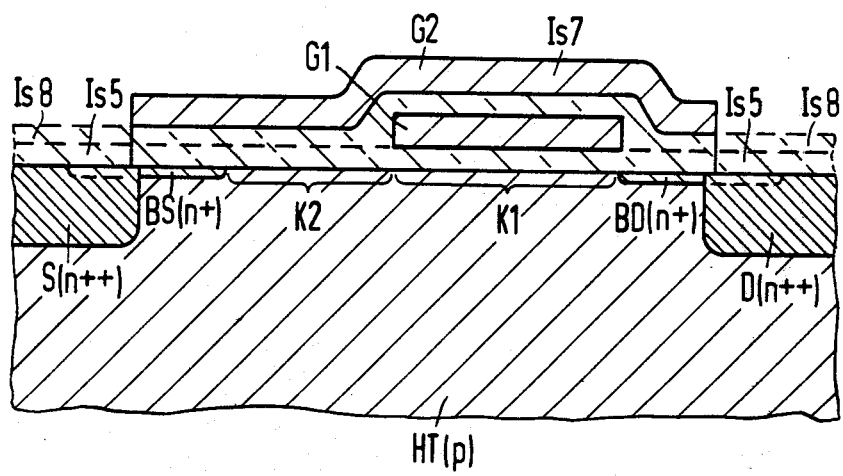
FIG. 3 is a fragmentary sectional view taken along the line III—III of FIG. 1.

The memory gate G1 can also be recognized in the sectional area, indicated in FIG. 1 and shown in FIG. 3. The two tongues L and the connection LK can also be recognized in the sectional area, indicated in FIG. 1, and shown in FIG. 2. From FIGS. 1 and 2, it can additionally be recognized that the first tongue L covers a portion of the drain D - compare FIG. 7 also, which shows the areas of drain D and source S illustrated in FIG. 1. From FIGS. 1, 2 and 7 can also be recognized that the second tongue L covers a portion of source S. The covering of drain D and source S can also be slight so that, in top view, the source and drain only adjoin the respective tongue L, instead of overlapping, more or less, with the tongue L. Even if, viewed in top view, the covering only consists of a close approaching of source and drain to the respective tongue L, instead of a direct adjoining, an erasing of the memory gate G1 via the corresponding tongue to the connecting area, ergo source or drain, is often still possible. In this border case, the distance between tongue L and the adjoining connecting area, S or D, is often sufficiently small in order to facilitate a discharge of the memory gate via the corresponding tongue in the corresponding connecting area. Whether a covering, as viewed from the top, and thus an overlapping, adjoining, or close proximity is present or not, can particularly be recognized therefrom whether the potential of the tongue L can still influence the pn-transfer, close to the tongue and situated between the substrate and the covered connecting area S or D. In case the distance from the tongue to the corresponding pn-transfer is too large, so that is much larger than the insulator thickness of the insulating layer $I_{s5}$ between tongue L and the adjoining substrate area Be,(see FIG. 2), the influence of the tongue potential upon the respective pn-transfer disappears. The potential differences, required for the erasing, between tongues L and the connecting area S or D, respectively, rapidly rise to very high values, which are not acceptable any longer, if the tongue is not in close proximity any longer to the respective pn-transfer, i.e. in case the tongue does not cover the respective connecting area S or D, any longer.

For technical reasons, for example, in implantations or heat diffusion, it is recommended to mount the corresponding pn-transfer below the tongue L instead of only leaving it approximately adjoining the periphery of tongue L. Indeed, one can often simultaneously utilize the tongue L in an advantageous manner as a mask for the subsequent production of the covered connecting area, whereby the respective connecting area not only adjoing but reaches, at least slightly, underneath the tongue L, as is indicated in FIGS. 1 and 2. If the covering is to be as extensive as indicated in FIGS. 1 and 2, the differences between the potentials, required for the erasing, between tongue and connecting area are particularly small.

The memory gate G1 illustrated in FIG. 1 controls the first segment K1 of the channel which here, in top view, has the shape of a flask. This channel portion thus exhibits a channel non-homogenity, namely a constriction Ab, by means of which the channel injection for the programming, provided in the invention, is facilitated. The channel attains this flask-shaped form in that, for example, a $1\mu$ thick oxide layer Du, in the area of the constriction identified as Do, is formed between substrate HT and memory gate G1 away from the channel; also compare FIG. 4 which explains more closely the areas with thick oxide Du/Do of the embodiment illustrated in FIG. 1. Only in the area of the actual channel K1 and K2 is a respective thin oxide layer of, for example 500 through 1200 A thickness mounted between substrate and memory gate, and between substrate and control gate—See FIG. 3 which is a sectional view along line III—III of FIG. 1.

Due to the fact that the memory gate G1 is conductively connected with two tongues L of which the first tongue is mounted in drain proximity and the second tongue is mounted in source proximity, the memory gate G1 can selectively be discharged with the aid of source S or with the aid of drain D.

If one wishes to, for example, advantageously utilize the Fowler-Nordheim tunnel effect for the discharge, one applies a corresponding voltage between control gate G2 and that connecting area S or D, compare FIG. 2, towards which the discharge is to proceed.

If, on the other hand, for example, the avalanche effect is to be advantageously utilized for the discharge, the avalanche break-through voltage is applied to the pn-transfer between the respective connecting area and the substrate, ergo between source S and substrate HT, or between drain D and substrate HT. Compare FIG. 2, which there produces those heated holes with whose aid the memory gate G1 is to be discharged. In order to let the heated holes reach the memory gate G1 through the insulating layer $I_{s5}$ via the tongue L, it is advantageous to simultaneously additionally apply a negative potential, vis-a-vis the respective connecting area S or D, to the control gate G2. This control potential capacitively displaces the memory gate potential in a negative direction so that the tongue potential, then strongly negative, attracts the heated holes.

The gate surface effect can also be utilized for the discharge in that the steepest possible erasing impulses, negative in relation to the potential of the respective connecting area, are applied to the control gate G2 and also a comparatively positive potential is applied to the respective connecting area S or D, whereby the discharge proceeds towards the respective connecting area. It is particularly advantageous to apply a p-doping in the tongue L which indeed supports the releasing of the gate surface effect. The gate surface effect can also be utilized for the discharge in that the steepest possible erasing impulses, positive in regard to the potential of the control gate, are applied to the respective connecting area S or D, and a comparatively negative potential is applied to the control gate G2.

As the discharge of the memory gate G1 in the inventive n-channel memory FET can selectively proceed with the aid of source S or the drain D, there is a particularly great freedom in the utilization of the inventive n-channel memory FET. Thus, the applicant can often more readily structure and dimension the remaining circuit, into which the inventive n-channel memory FET is inserted, in accordance with other requirements, that if he would utilize an n-channel memory FET erasable only via the drain, or only via the source.

The inventive mounting of two tongues enables one time an erasing to take place via the source S and, if required, another time an erasing of the same n-channel memory FET via the drain D. As already mentioned above, thie remaining circuit can represent a memory matrix containing a multiplicity of inventive n-channel memory FETs as memory cells. Due to the fact that the sources S of several of the n-channel memory FETs utilized are connected differently with one another than their drains D, by means of applying the potentials required for the erasing, one time to the source and the other time to the drain, one can respectively trigger different n-channel memory FETs or different numbers of n-channel memory FETs, respectively.

Figure 4:
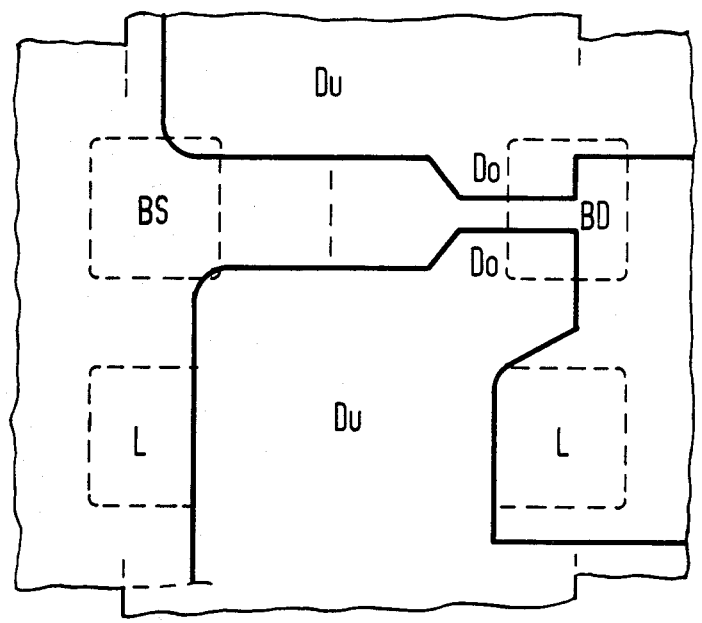
FIG. 4 illustrates the areas exhibiting a thick oxide layer which are illustrated in FIG. 1.

The invention, particularly provides the ability to connect all sources of all n-channel memory FETs with one another in a conductive manner, and to connect the drains of the n-channel memory FETs only column-wise (as already shown in FIG. 4 of the main application). Due to the fact that one applies the potential, required for the erasing, to the source, all n-channel memory FETs are thus source-wise triggered. However, if one applies the potential, required for the erasing to the drains, one can also column-wise trigger individual columns, or randomly several of said columns of these n-channel memory FETs. In case the control gates G2 of all n-channel memory FETs of this memory matrix are connected with another line-wise, one can respectively bit-wise erase the information, stored in the matrix, in this example by means of applying the control gate potential, required for the erasing, to the respective horizontal line when erasing via drain D. However, when erasing via source S, one can erase the information, stored in the matrix, respectively word-wise, that is line-wise.

The inventive measure to connect the memory gate G1 with two different tongues L so that selectively be erased drain-sided or source-sided, thus permitting, particularly when utilizing such n-channel memory FETs in a memory matrix erasure, bit-wise or word-wise in corresponding with the choice made or, when simultaneously applying the control gate potential to all feed lines, even matrix-wise, to erase the information stored in the memory matrix. In order to attain a matrix-wise erasing, thus, in the memory matrix embodiment mentioned, the erasing voltage is respectively to be applied between source S, on one hand, and all control gates, on the other hand, i.e. all horizontal lines, simultaneously. Due to the fact that not only bit-wise but also group-wise erasings can be carried via a horizontal line, the respective memory matrix can be reprogrammed more flexibly (and due to the group-wise erasing, when required, also particularly rapidly) instead of only facilitating a bit-wise or word-wise erasing—on the basis of the presence of only one single tongue L per memory gate G1—when the control gate potential is applied to the horizontal line.

The insulating layer $I_{s5}$ between the tongue L, on one hand, and source and drain, on the other hand, can also be structured thinner, compare FIG. 2, than the insulating layer ($I_{s5}$) between memory gate G1 and substrate HT, (compare FIG. 3) instead of being structured evenly thick as illustrated here. It can thereby be safeguarded that the discharge indeed proceeds only via the tongues instead of also directly via an edge of the memory gate G1 covering the respective connecting area.

In the sample embodiment illustrated in FIG. 1, also compare FIG. 2 and FIG. 3, said insulating layer $I_{s5}$ is respectively structured with even thickness. The discharge respectively proceeds reliably only via the tongue L instead of also directly via an edge of the memory gate G1, the surface of the p-substrate HT, (compare FIGS. 1 and 2) is p-doped to a greater degree in the area Be adjoining the pn-transfer, and respectively covered by the tongue, in comparison to the p-substrate itself. By means of this increased p-doping in the surface area Be, the avalanche breakdown voltage of this segment of the pn-transfer is lowered so that the corresponding pn-transfer, during erasing with the aid of the avalanche effect, produces heated holes only in the corresponding segment covered at least partially by the tongue L instead of also producing heated holes to the side away therefrom in direct proximity of the channel, and thus in proximity to the memory gate G1. The p-doping of the substrate surface Be underneath the tongue L is also suggested already by the application P 26 13 846.5 = VPA 75 P 6090 Federal Republic of Germany.

In the sample, illustrated in FIG. 1, this area Be underneath the tongue is respectively more p-doped than the doping of the p-substrate. Originally, namely with the aid of ion implantation, the total substrate surface in the larger area Bf, illustrated in FIG. 1, was more p-doped. In this manner it is safeguarded that no parasitic channel is formed laterally between the channel portion K1 and the area Be covered by the tongue, particularly not underneath the connection LK. The increased p-doping indeed prevents the formation of a conductive channel underneath the connection LK even when the memory gate G1 is discharged excessively, and thus was correspondingly charged positively, whereby the memory gate G1, the connection LK and the tongue L lie at a positive potential when the control gate potential is zero.

Because thick oxide was additionally applied outside of the channel K1/K2 between the connection LK and the substrate HT (See FIGS. 1 and 4) an additional safeguarding against the formation of a parasitic channel is additionally attained when the memory gate potential is positive. One can, particularly, let the more p-doped area Bf directly reach the channel K1/K2, illustrated in FIG. 1, whereby the formation of such a parasitic channel can even then be prevented when no thick oxide was mounted between the connection LK and the substrate HT. A more p-doped substrate surface Bf can often more readily be produced, particularly with the aid of ion implantation, than a thick oxide layer Du.

If one p-dopes the substrate surface Be underneath the tongue L more, the tongue or tongues L can also directly be connected to the memory gate G1. Thus, a connection LK between memory gate G1 and the corresponding tongue L per se is then dispensible. In that case the memory gate G1, together with the corresponding tongue, adjoins directly the source or drain, wherein underneath the tongues the substrate surface Be is more p-doped, but underneath the memory gate G1 the normal substrate-p-doping is present. Such an n-channel memory FET has a particularly small space requirement on the substrate surface even though the production tolerances, particularly in regard to the adjustment setting for the increased p-doping is often particularly limited and the danger of waste is correspondingly increased.

The insertion of the connection LK, compare FIG. 1, thus permits a lowering of the rejection quota and an increase of the production tolerances. Moreover, the large-area connection LK, covered by the control gate, permits the increase of the capacitance effective between memory gate G1 and control gate G2, and thus lowers the operation voltages of the n-channel memory FET. The effect of such a capacitance increase was already described in the German OS 24 45 091.5 and in the Luxemburg Pat. No. 72 605.

In the embodiment illustrated in FIG. 1, for facilitating an excessive discharge of the memory gate G1, i.e., in order to prevent damaging consequences of possibly occurring positive memory gate potentials when the memory gate G1 is discharged, the channel is additionally divided into two portions, namely the first portion K1 and the second portion K2, exhibiting the same width Abb. The memory gate G1 only covers the first portion K1 of the channel extending across the total width Abb/Ab of the channel, said portion which contains that channel non-homogeneity Abb from which heated electrons reach the memory gate by means of channel injection during the programming. The second channel portion K2 is not covered by the memory gate G1 but only by the control gate G2, compare FIGS. 1, 3 and 2.

Thus, the control gate and the memory gate are separated from the channel K1/K2 by thin oxide, compare FIG. 3, from the remaining substrate areas, however, primarily by thick oxide Du/Do, compare FIGS. 2 and 4. The control gate G2 directly capacitively effects the channel portion K2, the memory gate G1 and also the connection LK, compare FIGS. 1, 2, 3 and 5. Thereby the effectively effective capacitance between the control gate G2, on the one hand, and the memory gate and the connection G1/LK, on the other hand, is considerably larger than the capacitance between memory gate G1 and channel, here K1. In this embodiment, particularly low operating voltages can therefore be applied to the control gate G2. See FIGS. 17 through 20 of the Luxemburg Pat. No. 72 605 and FIGS. 1 through 4 of German OS 24 45 091.7. In addition, such a division-in-two of channel K1/K2, and its advantages are already described in said application and in the Luxemburg Pat. No. 72 605.

The memory gate G1 can also cover the total channel K1/K2, instead of only a portion K1 of the channel, and can thus control the total channel. This sample embodiment in which the memory gate is not only formed by the area G1, illustrated in FIG. 1, but also by the area G1', illustrated in FIG. 1, can advantageously more readily be produced than if the memory gate only covers the first portion K1 of the channel and thus only controls said first channel portion K1. This is also obvious from the description, yet to follow, about the production steps of the embodiment illustrated in FIG. 1, indeed, because the subsequent removal of the area G1' does not have to be carried out. However, a memory gate G1/G1', controlling the total channel, is to be discharged under tighter tolerances in order to prevent an excessive discharge, by means of which indeed the total channel K1/K2 would normally become conductive due to the positive memory gate potential, ergo with identical drain and control gate potential (normally-on-state).

Figure 6:
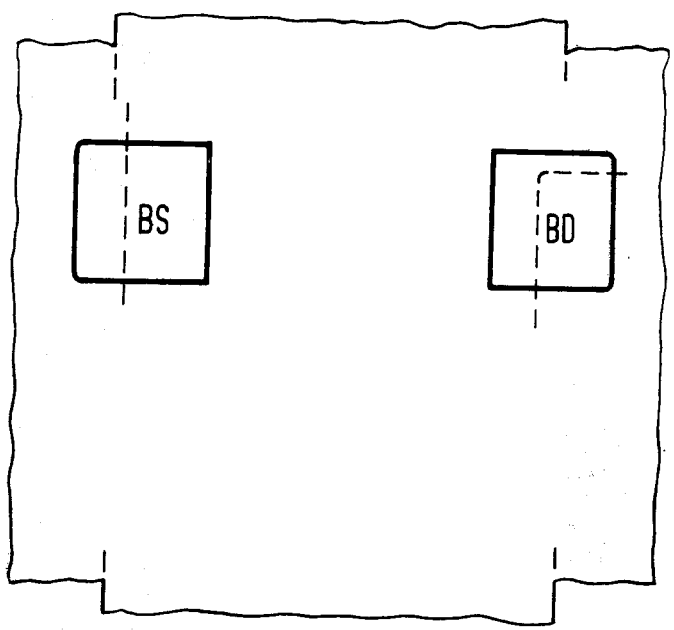
FIG. 6 illustrates the transition areas of FIG. 1, mounted between drain and channel, and between source and channel.
Figure 7:
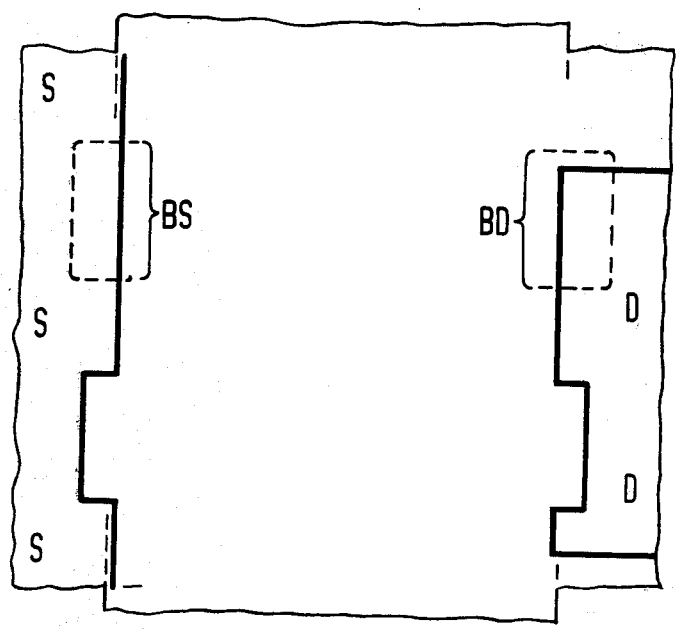
FIG. 7 illustrates the areas of drain and source shown in FIG. 1.

In the sample illustrated in FIG. 1, the source S and the drain D is additionally respectively separated by a thin transition area BS/BD, also compare FIGS. 6, 3 and 4. These n-doped transition areas particularly function for the lowering of the penetration voltage between the source S and the drain D when channel K1/K2 is non-conductive, and also in order to avoid a parasitic bipolar lateral transistor, formed by the source S and the drain D by a relatively short basis, i.e., short channel K1/K2. There, in addition, the drain-sided transition area BD is controlled by the control gate G2, compare FIGS. 1 and 3, whereby also the danger of an adjacent word disturbance is avoided.

For the production of the embodiments illustrated in FIG. 1, conventional process steps can be utilized, in particular. For example, one can successively utilize the following process steps:

Onto a planar type substrate HT, one applies a thin plane insulating layer $I_{s5}$ which is later to separate the substrate HT from the tongues L and from the memory gate G1 (FIG. 3).

Subsequently, the p-doping in the area Bf, compare FIG. 1, of the substrate surface is increased by means of ion implantation through the insulating layer $I_{s5}$. Such a method for ion implantation is already known, for example, from IEEE Trans. Electron. Dev. Edition 19 (July, 1972), Volume 6, pages 774 through 781, and IEEE Trans. Electron. Dev. Edition 22 (October, 1975), Volume 10, Pages 849 through 857.

The thick oxide layers Du/Do, illustrated in FIG. 4, can be produced in the following by means of local oxidation. Thereby, in the area of said thick oxide layer, compare FIG. 2, the increased p-doping of the firstly flat area Bf is displaced downwardly by the amount of Du, compare Bf', so that the thick oxide layer is there actually formed by Du together with Du' and $I_{s5}$.

Subsequently, a polycrystalline silicon layer is grown on $I_{s5}$ and Du/Do. One first produces the memory gate G1 continuously from said polycrystalline silicon layer, the area G1' connecting thereto, the connection LK and the two tongues L, compare FIG. 5, in that you remove the polycrystalline silicon at all remaining locations with the aid of a mask, whereby G1, G1', LK and L remain.

Subsequently, the transition areas BS, BD can be produced. Thereto, ion implantation is utilized, whereby G1/G1' can simultaneously be utilized as mask.

With the aid of an additional mask, the area G1', compare FIGS. 1 and 5, is subsequently again removed so that the potential of the memory gate G1 can control the first channel portion K1 but not the other channel portion K2.

The insulating layer $I_{s7}/I_{s8}$, compare FIGS. 2 and 3, can be grown next. Said insulating layer is to later separate the memory gate G1 from the control gate G2, and also separate the connection LK including tongue L from the control gate G2.

Subsequently one again grows a polycrystalline silicon layer on $I_{s7}/I_{s8}$, for example. The control gate G2 is produced from said silicon layer with the aid of a mask in that all areas not belonging to said control gate G2 of said silicon layer are again removed. Thereby, the control gate G2 remains.

Source S and Drain D can next be produced. Here one can utilize, for example, ion implantation in that one implants through the insulating layer $I_{s5}/I_{s8}$. The tongues L and the control gate G2 can also be utilized as mask in this implantation. In place of producing source S and drain D by means of ion implantation, the insulating layer $I_{s8}$, and also those areas of the insulating layer $I_{s5}$, lying above the source and drain, compare FIG. 7, can again be etched off. This etching-off is schematically indicated in FIG. 2 by hatching the insulating layer, there. Because the substrate surface is then again freely accessible, the source S and the drain D can respectively be produced as diffused areas.

Subsequently, an additional insulating layer can be applied, not shown in FIG. 2, covering everything for the protection of the n-channel memory FET.

It will be apparent to those skilled in the art that many modifications and variations may be effected without departing from the spirit and scope of the novel concepts of the present invention.

I claim as my invention:

1. An n-channel memory FET comprising a p-type semiconductor substrate, heavily doped $n^{++}$ source and drain regions directly beneath one surface of said substrate and having a channel area between said source and drain regions, a thick layer of insulating material on said one surface of said substrate, said insulating layer having a relatively thick portion except for a thin film portion above said channel region between said source and drain, said thin portion having an outline which is broad near said source region and narrow near said drain region and which is continuously narrowed in a view of said source region toward said drain region when viewed at right angles to the plane of said one surface of said substrate, a memory gate formed of conductive material spaced from said surface, said insulating layer completely surrounding said memory gate, said memory gate being located above one portion of the length of said channel area, said memory gate including a first tongue formed of conductive material and conductively connected to said memory gate covering said source and capacitively connected thereto and a second conductive tongue covering said drain and capacitively connected thereto, and a control gate above said memory gate and separated therefrom by a layer of insulating material, said memory gate being connected to at least one of said two tongues across an extensive conductive connection separated from said substrate by a thick insulating layer.

2. An n-channel memory FET comprising a p-type semiconductor substrate, heavily doped $n^{++}$ source and drain regions directly beneath one surface of said substrate and having a channel area between said source and drain regions, a thick layer of insulating material on said one surface of said substrate, said insulating layer having a thickness of approximately $1\mu$ except for a thin portion of approximately 500 to 1200 A above said channel region between said source and drain, said thin portion having an outline which is broad near said source region and narrow near said drain region and which is continuously narrowed in a view from said source region toward said drain region when viewed at right angles to the plane of said one surface of said substrate, a memory gate formed of conductive material spaced from said surface, said insulating layer completely surrounding said memory gate, said memory gate being located above one portion of the length of said channel area, said memory gate including a first tongue formed of a conductive material and conductively connected to said memory gate covering said source and capacitively connected thereto and a second conductive tongue covering said drain and capacitively connected thereto, and a control gate above said memory gate and separated therefrom by a layer of insulating material, said memory gate being connected to at least one of said two tongues across an extensive conductive connection separated from said substrate by a thick insulating layer.

3. An enhancement type n-channel FET for storing and retrieving a binary number comprising a p-type single crystal silicon substrate, heavily doped $n^{++}$ spaced regions in one surface of said substrate forming a source and a drain with a channel region therebetween, a layer of insulation on said one surface, a floating gate buried in said insulation above said channel region, an externally controllable control gate on said insulation above said memory gate, two conductive tongues electrically part of said memory gate which extend therefrom into close proximity to and above part of said source and drain, respectively, but separated therefrom by a thin portion of said insulating layer, said channel region being relatively narrow in width over a first portion near said drain and relatively wide near said source, said floating gate being located above at least said narrow channel region and a portion of said wide channel region, said memory gate being connected to at least one of said two tongues across an extensive conductive connection separated from said substrate by a thick insulating layer.

4. An n-channel memory FET having a floating memory gate formed of conductive material comprising a semiconductor substrate of p-type conductivity, heavily doped spaced $n^+$ doped regions of the opposite conductivity type in said substrate forming a source and a drain section, a channel region below said floating memory gate, said floating memory gate covering at least a first channel portion of said channel region, said floating gate being surrounded on all sides by an insulator, means for transferring electrons to said memory gate by channel injection of electrons which have been strongly accelerated in their own conductive channel as a result of being heated up by an electric field effective in the source-drain direction and overcoming the energy threshold to the conductivity band of said insulator to thereby reach said memory gate, whereby channel injection injects said electrons in said memory gate affecting said first channel portion in an inhibiting manner by means of its negative charge, a controllable control gate separated from said memory gate by a layer of insulating material which capacitively affects said memory gate, a first conductive tongue via which the discharge of said memory gate proceeds during electrically controlled erasing, said tongue covering at least a portion of one of said n+-doped regions, said tongue being separated from said one of said n+-doped regions by a thin layer of insulating material, a second tongue connected to said memory gate, said first tongue covering a portion of said drain and said second tongue covering a portion of said source, said memory gate being connected to at least one of said two tongues across an extensive conductive connection separated from said substrate by a thick insulating layer.

5. An n-channel memory FET in accordance with claim 4, in which the insulating layer separating at least one of said tongues from said connection region covered by it, is thinner than the insulating layer separating said memory gate from said channel.

6. An n-channel memory FET in accordance with claim 4, in which the surface of said p-substrate adjoining the pn-transfer (H/HT, D/HT), covered by the tongue, underneath the corresponding tongue, is p-doped in increased measure.

7. An n-channel memory FET in accordance with claim 6, in which the substrate surface which is more p-doped reaches up to the channel.

8. An n-channel memory FET in accordance with claim 7, in which said memory gate is directly connected to one of said tongues.

9. An n-channel memory FET in accordance with claim 4, in which said memory gate covers only a first portion of said channel, and a second portion of said channel is covered by said control gate, but not by said memory gate.

10. An n-channel memory FET having a floating memory gate formed of conductive material comprising a semiconductor substrate of p-type conductivity, heavily doped spaced n+-doped regions of the opposite conductivity type in said substrate forming a source section and a drain section, a normally nonconductive channel between said source and drain a floating memory gate above said non-conductive channel and separated therefrom by a thin film of insulation material, said floating gate being surrounded on all sides by insulation, means for storing a charge in said memory gate by channel injection of electrons which have been strongly accelerated in their own conductive channel by the application of a voltage between said drain and source sufficient to overcome the energy threshold to the conductivity band of said insulator, a controllable control gate separated from said memory gate by a layer of insulating material which capacitively affects said memory gate, a first conductive tongue extending from said memory gate, said tongue covering at least a portion of one of said n+-doped regions, said tongue being separated from said one of said n+-doped regions by a thin layer of insulating material, a second conductive tongue connected to said memory gate, said first tongue covering a portion of said drain, said second tongue covering a portion of said source, and said memory gate covering both channel portions alongside their total length, and terminal means in said control gate by which a voltage may be applied to said control gate to force charges out of said memory gate, said memory gate being connected to at least one of said two tongues across an extensive conductive connection separated from said substrate by a thick insulating layer.

11. An n-channel memory FET in accordance with claim 4, in which said memory gate covers both channel portions alongside their total length.

12. An n-channel memory FET in accordance with claim 4, in which an n-doped transition area is inserted between said drain and said channel, said transition area being thinner than said drain.

13. An n-channel memory FET in accordance with claim 12, in which an n-doped transition area is formed between said source and said channel, said transition area being thinner than said source.

* * * * *